United States Patent [19]
Combs, Jr.

[11] 3,953,255
[45] Apr. 27, 1976

[54] FABRICATION OF MATCHED COMPLEMENTARY TRANSISTORS IN INTEGRATED CIRCUITS

[75] Inventor: Clyde Combs, Jr., Satellite Beach, Fla.

[73] Assignee: Harris Corporation, Cleveland, Ohio

[22] Filed: Dec. 6, 1971

[21] Appl. No.: 204,821

[52] U.S. Cl. .................. 148/187; 29/580; 323/23; 148/190; 357/49
[51] Int. Cl.² ........................................ H01L 21/22
[58] Field of Search .......... 148/187 II, DIG. 190, 148/187, 190; 29/580; 317/235; 323/23

[56] References Cited
UNITED STATES PATENTS

| | | | |
|---|---|---|---|
| 3,327,182 | 6/1967 | Kisinko | 317/235 |
| 3,411,200 | 11/1968 | Formigoni | 29/580 |
| 3,474,308 | 10/1969 | Kronlage | 317/235 |
| 3,483,464 | 12/1969 | Embree et al. | 323/22 |
| 3,502,951 | 3/1970 | Hunts | 317/235 |
| 3,511,724 | 5/1970 | Ohta | 148/187 |
| 3,582,724 | 6/1971 | Nakahara et al. | 317/235 |
| 3,615,932 | 10/1971 | Makimoto et al. | 148/190 X |
| 3,617,827 | 11/1971 | Schmitz et al. | 317/235 |
| 3,707,410 | 12/1972 | Tauchi et al. | 148/187 |

OTHER PUBLICATIONS

Fuller et al., "Diffusion of Donor and Acceptor Elements in Silicon," J. Appl. Phys., Vol. 27, No. 5, May 1956, pp. 544–553.

*Primary Examiner*—L. DeWayne Rutledge
*Assistant Examiner*—J. M. Davis

[57] ABSTRACT

Complementary semiconductor devices are fabricated in single crystal semiconductor segments within a monolithic substrate, using planar diffusion techniques. An impurity element of one conductivity-determining type is partially diffused into one of a pair of the single crystal segments having opposite conductivity types to one another. Thereafter, a second impurity element of the other conductivity-determining type and having a faster diffusion coefficient than the first element is diffused into the second of the pair of single crystal segments at a time and for a temperature sufficient to effect penetration of both impurities to substantially the same depth in their respective segments. The concentrations of the impurities are selected to provide common operational element regions of the complementary devices with substantially identical resistivities.

16 Claims, 4 Drawing Figures

FABRICATION OF MATCHED COMPLEMENTARY TRANSISTORS IN INTEGRATED CIRCUITS

BACKGROUND OF THE INVENTION

1. Field

The present invention pertains to semiconductor devices, and is particularly directed toward the fabrication of true complementary devices in monolithic integrated circuits (ICs).

2. Prior Art:

Various methods have previously been proposed and used in an effect to fabricate complementary devices in a single substrate. To date, none has proved entirely successful to produce true complementary devices such as PNP and NPN bipolar transistors, in the sense that the transistors possess closely similar or matching electrical characteristics including collector resistivity, base resistivity, base penetration, base width, and emitter resistivity. Some integrated circuits are entirely formed within a wafer of single crystal semiconductor material, and what is effectively the substrate of many of the incorporated devices is typically used as the collector region of one type of bipolar transistor. It is virtually impossible to fabricate complementary transistors in such structures.

Techniques heretofore proposed for producing complementary transistors include those disclosed in U.S. Pat. No. 3,473,090 issued Oct. 14, 1969 to Bohannon, U.S. Pat. No. 3,474,308 issued Oct. 21, 1969 to Kronlage, and U.S. Pat. No. 3,576,682 issued Apr. 27, 1971 to Frouin et al.

SUMMARY OF THE INVENTION:

The present invention distinguishes over the prior art in the use of impurity elements in a diffusion sequence which takes advantage of their successively faster diffusion coefficients in the single crystal semiconductor material in which the complementary transistors are to be formed, and in the use of processing times and temperatures for the various diffusion elements such that as each impurity element is being at least partially diffused into a respective segment of the material during its portion of the sequence the earlier-introduced impurity elements are being accumulatively diffused further into their segments. The processing sequence is predetermined so that when the last impurity element is diffused to its desired depth the earlier impurity elements also arrive at their final predetermined depths, the junction depths between common operational elements of the complementary transistors being substantially the same at the completion of this step of the sequence. Moreover, the concentrations of impurity elements in the final device structure provides substantially common resistivities for the respective collector, base, and emitter regions of the complementary transistors.

Figure 1:
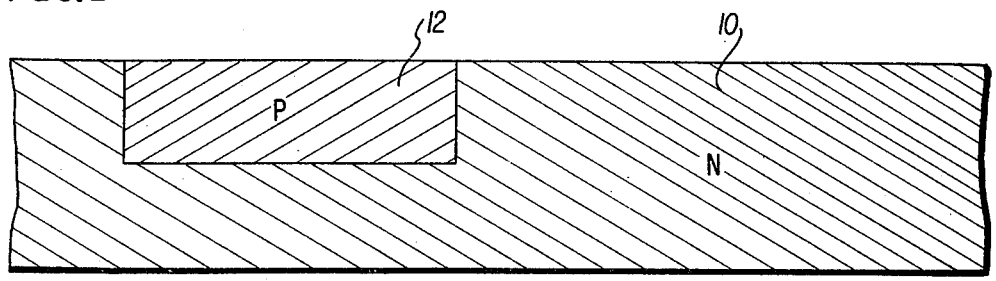
FIGS. 1–4 are cross-sectional views of an integrated circuit structure at successive stages of development in the fabrication of complementary transistors.

DESCRIPTION OF THE PREFERRED EMBODIMENT:

Referring to FIG. 1; an N-type wafer 10 of single crystal silicon which is ultimately to be used in fabricating at least one NPN transistor and perhaps other devices is provided with a P-type single crystal silicon region 12 which is ultimately to be used in fabricating at least one PNP transistor and perhaps other devices. The P-type region 12 may conveniently be formed by deposition (including ion implantation) and diffusion of a P-type impurity or by etching away a portion of the original wafer and epitaxially regrowing a P-type layer in the void. The N-type and P-type regions 10 and 12 may, for example, have resistivities of 2.6 ohm-cm and 2.0 ohm-cm, respectively. As well presently become apparent, the P-type region or regions may alternatively be provided at a later stage of the process.

Figure 2:
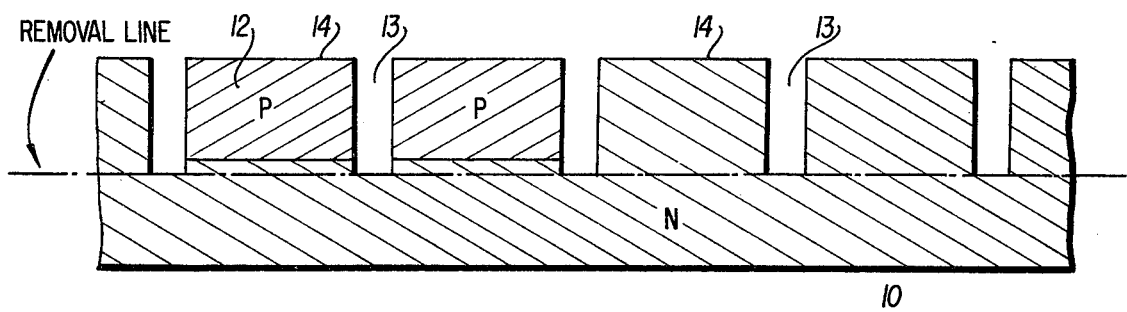
Figure 3:
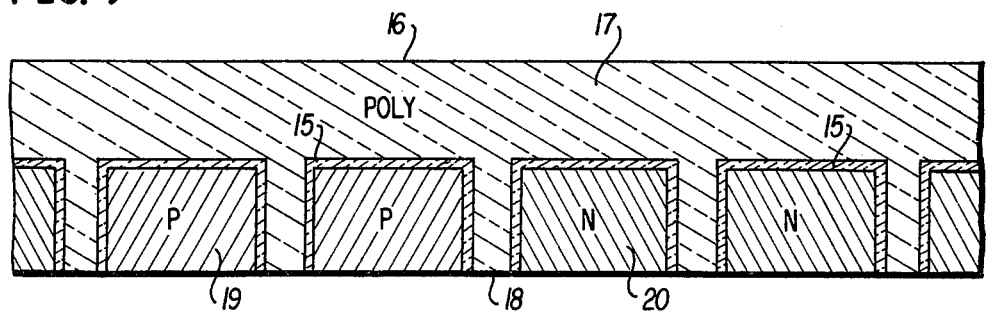

After oxidation, and definition of a desired etch pattern in the resulting oxide mask by standard photoresist techniques, moats (channels) 13 are etched in the predetermined pattern from the planar surface 14 of wafer 10 (FIG. 2). It will be appreciated that the shape of the moats 13 shown in the drawing is purely for the sake of clarity and that this shape may vary according to the specific etching technique employed. The surfaces of moats 13 and the remaining surface 14 are covered with a thin layer 15 of dielectric material (FIG. 3). Preferably, this is silicon dioxide ($SiO_2$) which has been thermally grown or deposited in a uniform layer up to approximately 20,000 angstroms (A) thick. Thereafter, silicon is epitaxially deposited on dielectric layer 15 (and because of the oxide, deposits in polycrystalline form) to fill the moats and to cover the entire oxide coated surface in a relatively thick layer. Lapping and polishing of both sides of the resulting structure provides parallel planar surfaces 16, for polycrystalline substrate 17, and 18 in which single crystal silicon islands 19 of P-type material and 20 of N-type material each surrounded by dielectric layer 15 are exposed in the polycrystalline substrate (FIG. 3). If an N-type wafer had been employed as the starting material without incorporating P-type region 12 at that time, all of the islands would at this point be N-type. In that event, P-type islands 19 could now be provided by heavy diffusion of P-type impurities to the desired resistivity value throughout the island. In a particular situation it may also be desirable to cover the surface of the original wafer with a heavy doped epitaxial layer (not shown) which ultimately constitutes the bottom layer of the islands. The present invention does not preclude the use of any of these and other conventional techniques for fabricating devices in a monolithic dielectrically isolated body.

The invention takes advantage of the availability of conductivity-type determining (donor and acceptor) impurities which diffuse at different rates, relatively faster and slower than others, in a given pure semiconductor body. For example, arsenic, antimony, and phosphorus are all N-type impurities (hereinafter sometimes referred to as "diffusants" or "dopants") but arsenic and antimony are characterized as "slow" diffusants whereas phosphorus is a "fast" diffusant. Similarly, boron and gallium are P-type diffusants, but gallium is slightly faster than boron. In a preferred embodiment of the invention complementary transistors are fabricated in opposite conductivity type islands of a monolitic dielectrically isolated body as shown in FIG. 3, using antimony, phosphorus, and boron as diffusants.

It is known that the junction depth, x, of impurity diffusion into a semiconductor region of different conductivity type is a function of the diffusion coefficient, D, of that impurity at a given temperature and the time, t, over which diffusion of that impurity at that temperature is carried out. Mathematically, this function is stated as $$x = 5.4 \sqrt{Dt}.$$

In essence, then, if the base-collector junction depths of the complementary transistors are to be the same, and also the emitter-base junction depths, then the various times and temperatures at which the structure of FIG. 3 is to be processed must be accumulatively accounted for, for each different impurity, to assure that these desired uniform penetrations are achieved. Further, in general where several processing steps are to be carried out in succession, the slower diffusant of a given conductivity-determining type should be employed initially because it will be subjected to high temperatures over the longest period of time. Hence, it should "programmed" to penetrate to the desired junction depth in accordance with those considerations. Boundary conditions are readily established for any given semiconductor body, such as silicon which is the preferred material here, by resort to graphs and/or tables designating diffusion coefficients of donor and acceptor impurities into silicon (measured in cm$^2$/sec, versus temperature) and designating solid solubilities of impurity elements in silicon (in atoms/cc, versus temperature). The temperature capabilities of the processing equipment to be employed clearly must be considered in the context of selecting realizable temperatures.

Figure 4:
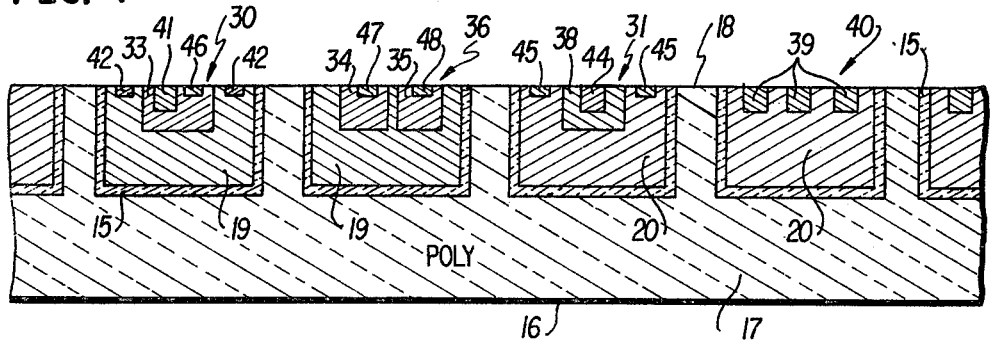

Utilizing these principles and conditions, the integrated circuit structure shown in FIG. 4, which includes complementary transistors 30, 31 formed in semiconductor islands 19, 20, is fabricated as follows for an island depth of 25 microns. Initially, antimony is used as the N-type dopant to form the base region 33 of PNP transistor 30, and the source and drain regions 34, 35 of an N-channel metal-oxide-silicon field effect transistor (MOSFET) 36. To that end, the antimony is deposited (or implanted) in a pattern conforming to these desired using well known masking and deposition techniques. Then the antimony, being a slow diffusant, is partially diffused into the respective islands at a temperature of 1275°C. for approximately two hours and fifteen minutes.

After further masking, boron is deposited in the appropriate surface areas of the islands for initial formation of various P-type regions of the IC, consisting of the base 38 of NPN transistor 31, and the plural regions 39 of a P-type diffused resistor 40. The boron is partially diffused into these regions at 1200°C. for about 45 minutes. During the latter period the previously dispersed antimony is diffused to a somewhat greater depth in regions 33, 34 and 35, but not yet to the full design depth of these regions.

Next, a heavier concentration of boron is deposited for initial formation of P+ regions consisting of the emitter 41 and the collector ring 42 of PNP transistor 30. Partial diffusion of the latter is carried out at 1150°C. for twenty minutes, thereby also increasing the penetration of the earlier-dispersed boron and antimony in their respective regions. Finally, large concentrations of phosphorus are deposited in appropriate surface regions to ultimately form the N+ emitter region 44 and collector ring 45 of NPN transistor 31, and the N+ contact regions 46, 47 and 48 to the base of transistor 30 and the source and drain of FET 36, respectively. The phosphorus is then diffused to the full depth of the desired N+ regions at 1100°C. for about twenty minutes. Simultaneously, the previous impurities are diffused to their final depths for the respective regions they are to form. The result is the IC structure shown in FIG. 4. Remaining steps include the provision of isolation and passivation layers and of contact, electrode, and interconnect metallization layers, using conventional techniques.

The diffusion times and temperatures for the exemplary process described above are ascertained from the initial requirement that, for complementary devices, the junction depths of the base regions be equal and of the emitter regions be equal. The antimony was partially diffused over four different high temperatures diffusion steps to achieve full depth, viz., the period and temperature of its own initial diffusion, and the respective periods and temperatures for successive diffusion of P-type boron, P+-type boron, and N+-type phosphorus. Similarly, the P-type boron was subjected to several successive distinct high temperature diffusion periods, viz., its initial diffusion, the subsequent processing for diffusion of P+-type boron, and the final processing for diffusion of N+-type phosphorus. The P+-type was partially diffused in an initial diffusion period, and to the final depth during diffusion of the phosphorus. Finally, the phosphorus was diffused to the desired depth in only one step. Mathematically, of course, solutions are readily achieved for the set of simultaneous equations which may be written involving junction depths, diffusion coefficients, temperatures, and time intervals, assuming desired values are selected for a sufficient number of the unknowns. In most instances, the attainment of desired junction depths will require the use of slow and fast diffusants, particularly where two or more planar junctions exist in each complementary device.

For the specific embodiment described above, PNP transistor 30 had a collector resistivity of 2.0 ohm-cm (corresponding to an impurity concentration of approximately $7 \times 10^{15}$ atoms/cm$^3$ boron), a base resistivity of 122 ohms-square, a base penetration (i.e., collector-base junction depth) of 3.24 microns, an emitter resisitivity of 3.5 ohms-square, and an emitter penetration (i.e., emitter-base junction depth) of 1.47 microns. NPN transistor 31 had a collector of 2.6 ohm-cm (corresponding to an impurity concentration of approximately $1.8 \times 10^{15}$ atoms/cm$^3$ of antimony), a base resistivity of 132 ohms-square, a base penetration of 3.24 microns, an emitter resistivity of 1.9 ohms-square, and an emitter penetration of 2.03 microns. This strong similarity between parameter values and dimensions of the complementary transistors carries over into the device characteristics. Thus, for example, PNP transistor 30 had an $h_{FE}$ of about 40 at $T_C = 1$ ma and $V_{CE} = 5$ v, $BV_{CBO}$ of 40 volts at $I_C = 10$ μA, $BV_{CEO}$ of 22 volts at $I_C = 3$ mA, $BV_{EBO}$ of 10 volts at $I_B = 10$ μA. Under the same conditions NPN transistor 31 had characteristic values as follows: $h_{FE} \cong 35$, $BV_{CBO} = 65$ v, $BV_{CEO} = 54$ v, and $BV_{EBO} = 9$ v.

I claim:

1. A process for providing matched complementary transistors in an integrated circuit, which comprises:
    partially diffusing a first impurity of one conductivity-determining type into a first collector region of opposite conductivity type extending to a major planar surface of a body of single crystal material to form a first base region extending to said surface within said first collector region, said first impurity having a relatively slow diffusion coefficient in said single crystal material, partially diffusing a second impurity of said opposite conductivity-determing type having a relatively faster diffusion coefficient in said crystal material into a second collector region of said one conductivity type extending to said surface and spaced apart from said first collector region along said surface of said body to form a second base region extending to said surface within said second collector region, while simultaneously increasing the depth of penetration of said first impurity in said first collector region, partially diffusing another portion of said second impurity into said first region to form a first emitter region extending to said surface within said first base region, while simultaneously increasing the depth of penetration of said first and second impurities in the first and second collector regions, respectively, and diffusing a third impurity of said one conductivity-determining type having a still faster diffusion coefficient in said single crystal material into said second base region to form a second emitter region extending to said surface within said second base region, while simultaneously increasing the depth of penetration of said first and second impurities in the first and second collector regions and in the first base region, respectively, said diffusing steps being performed at temperatures and for times sufficient to produce substantially equal final base-collector junction depths from said surface, and substantially equal base-emitter junction depths from said surface, within said first and second collector regions.

2. The process according to claim 1, wherein said impurities are diffused in concentrations to produce first and second base regions of substantially the same resistivity, and first and second emitter regions of substantially the same resistivity, and wherein said first and second collector regions are of substantially the same resistivity, in said complementary transistors.

3. The process according to claim 1, wherein said single crystal material is silicon.

4. The process according to claim 3, wherein said first impurity is antimony, said second impurity is boron, and said third impurity is phosphorus.

5. The process according to claim 1, wherein said first collector region and said second collector region are in separate dielectrically isolated single crystal semiconductor islands within a substrate.

6. The process according to claim 5, further including fabricating other semiconductor devies in others of said dielectrically isolated single crystal islands within said substrate at least in part simultaneously with the fabrication of said complementary transistors.

7. The process according to claim 1, further including fabricating other semiconductor devices in the single crystal semiconductor material of said integrated circuit at least in part simultaneously with the fabrication of said complementary transistors.

8. A process for fabricating electrically isolated complementary semiconductor devices in a semiconductor body having at least a pair of single crystal regions of opposite conductivity type, said process comprising:

diffusing into a surface of one of said pair of regions an impurity of opposite conductivity-determining type thereto, and diffusing into a surface of the other of said pair of regions a different impurity of opposite conductivity-determining type thereto having a relatively faster diffusion coefficient in said single crystal regions than the first-named impurity, at a temperature and for a time sufficient to diffuse both of said impurities to substantially the same final juncton depth within their respective single crystal regions.

9. The process according to claim 8, wherein both of said pair of single crystal regions have the same depth in said body.

10. The process according to claim 8, wherein said single crystal regions are dielectrically isolated from one another and from the remainder of said body.

11. The process according to claim 8, wherein said first-named impurity and said different impurity are diffused in such concentrations into their respective single crystal regions to form internal regions therein each having substantially the same resistivity as the other.

12. A method of fabricating complementary semiconductor devices in a monolithic substrate, which comprises:

sequentially introducing a plurality of different conductivity-determining impurities having different diffusion coefficients into two spaced-apart single crystal semiconductor segments of opposite conductivity type in said substrate, diffusing each introduced impurity in the sequence into its respective single crystal semiconductor segment at a temperature and for a period sufficient to obtain at least partial diffusion of that impurity toward a desired depth in the respective single crystal semiconductor segment while simultaneously diffusing each earlier-introduced impurity further toward a final desired depth in the respective segment, until predetermined substantially common junction depths are attained between corresponding operational regions of the two segments to form matched complementary devices.

13. The method according to claim 12, wherein at least three different impurities are introduced into said single crystal semiconductor segments.

14. The method according to claim 13, wherein said plural impurities are antimony, boron, and phosphorus.

15. The method according to claim 14, wherein said complementary devices are transistors.

16. The method according to claim 15, wherein at least the base regions of the complementary transistors have substantially common resistivities.

* * * * *